(12) United States Patent
Yang et al.

(10) Patent No.: US 11,764,106 B2
(45) Date of Patent: Sep. 19, 2023

(54) SEMICONDUCTOR DEVICE AND METHOD OF MANUFACTURE

(71) Applicant: TAIWAN SEMICONDUCTOR MANUFACTURING COMPANY LIMITED, Hsin-Chu (TW)

(72) Inventors: Tai-I Yang, Hsinchu (TW); Wei-Chen Chu, Taichung (TW); Yung-Chih Wang, Taoyuan (TW); Chia-Tien Wu, Taichung (TW); Hsin-Ping Chen, Hsinchu County (TW); Shau-Lin Shue, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 105 days.

(21) Appl. No.: 17/240,006

(22) Filed: Apr. 26, 2021

(65) Prior Publication Data

US 2021/0242076 A1    Aug. 5, 2021

Related U.S. Application Data

(62) Division of application No. 16/559,450, filed on Sep. 3, 2019, now Pat. No. 10,991,618.

(51) Int. Cl.
*H01L 21/768*    (2006.01)
*H01L 23/522*    (2006.01)
*H01L 21/311*    (2006.01)
*H01L 23/528*    (2006.01)

(52) U.S. Cl.
CPC .. *H01L 21/76802* (2013.01); *H01L 21/31144* (2013.01); *H01L 21/76831* (2013.01); *H01L 21/76877* (2013.01); *H01L 21/76885* (2013.01); *H01L 23/5226* (2013.01); *H01L 23/5283* (2013.01)

(58) Field of Classification Search
CPC ......... H01L 21/76897; H01L 21/76808; H01L 21/76877; H01L 21/76802; H01L 21/31144; H01L 21/76885
See application file for complete search history.

(56) References Cited

U.S. PATENT DOCUMENTS 9,704,760 B2    7/2017  Ok et al.
2019/0363048 A1*  11/2019  Zhao ............... H01L 23/5226
2020/0168555 A1   5/2020  Huang et al.

* cited by examiner

*Primary Examiner* — David A Zarneke
(74) *Attorney, Agent, or Firm* — COOPER LEGAL GROUP, LLC

(57) ABSTRACT

A semiconductor device includes a conductive line and a conductive via contacting the conductive line. A first dielectric material contacts a first sidewall surface of the conductive via. A second dielectric material contacts a second sidewall surface of the conductive via. The first dielectric material includes a first material composition, and the second dielectric material includes a second material composition different than the first material composition.

20 Claims, 8 Drawing Sheets

SEMICONDUCTOR DEVICE AND METHOD OF MANUFACTURE

RELATED APPLICATIONS

This application is a divisional of U.S. patent application Ser. No. 16/559,450, filed on Sep. 3, 2019, which is incorporated herein by reference.

BACKGROUND

Contacts are used to make electrical connections in or among different features in a semiconductor device. A contact, for example, is used to connect one metal layer to another metal layer or to a device layer, where the metal layers and device layers are otherwise electrically isolated from one another, such as by a dielectric material separating the metal layers from each other or separating the metal layer from the device layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
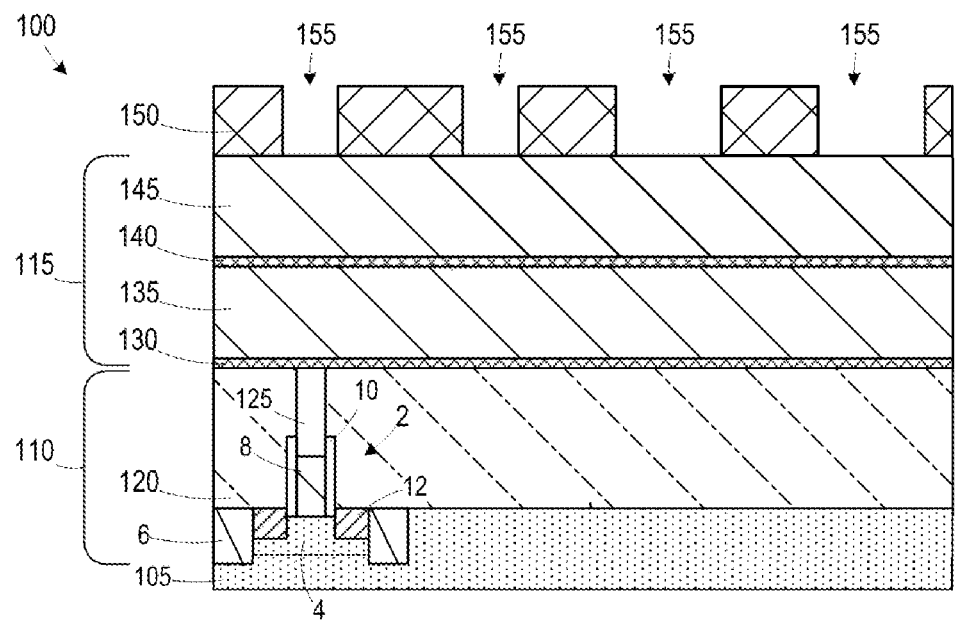
FIGS. 1-16 are illustrations of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor device are provided herein. In some embodiments, conductive lines of a first metallization layer are formed and conductive pillars are formed in the conductive lines in locations where conductive vias from a second metallization layer formed over the first metallization layer are to be formed. In some embodiments, the conductive pillars are recessed to form via openings that are filled with a conductive material using a self-aligned process to define the conductive vias in the second metallization layer. In some embodiments, the conductive vias electrically couple the conductive lines of the first metallization layer to conductive lines of the second metallization layer.

Turning to FIG. 1, a plurality of layers used in the formation of a semiconductor device 100 are illustrated, in accordance with some embodiments. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon. In some embodiments, the plurality of layers comprises a device layer 110 and a first metallization layer 115. In some embodiments, the device layer 110 comprises integrated circuit elements, such as a FinFET transistor 2. In some embodiments, the device layer 110 comprises other circuit elements such as planar transistors, capacitors, resistors, or other suitable devices, which are not individually illustrated. In some embodiments, the first metallization layer 115 represents a region in which interconnections are made between layers of the semiconductor device 100 positioned under the first metallization layer 115 and layers of the semiconductor device 100 positioned over the first metallization layer 115. In some embodiments, one or more metallization regions are formed between the device layer 110 and the first metallization layer 115. Thus, the first metallization layer 115 may be an M1 layer (i.e., a first metallization layer closest to the device layer 110) or an Mx layer, where x is an integer greater than or equal to 2.

In some embodiments, a fin 4 is formed in the semiconductor layer 105 by etching trenches in the semiconductor layer 105 using a patterned hard mask. Thus, the fin 4 is formed from the semiconductor layer 105. In some embodiments, the fin 4 is formed, such as grown, over the semiconductor layer 105. In general, the fin 4 defines an active region for forming devices, such as the FinFET transistor 2. In some embodiments, an isolation structure 6, such as shallow trench isolation (STI), is formed adjacent the FinFET transistor 2 to isolate the FinFET transistor 2 from adjacent devices by forming a recess in the semiconductor layer 105 and filling the recess with a dielectric material. In some embodiments, the isolation structure 6 comprises silicon oxide or other suitable materials.

In some embodiments, a gate structure 8 is formed over the fin 4. According to some embodiments, the gate structure 8 is formed by forming a sacrificial gate structure comprising a sacrificial gate dielectric layer, a sacrificial polysilicon layer, and a hard mask layer over the fin 4 and the isolation structure 6. In some embodiments, a patterning process is performed to pattern the hard mask layer corresponding to the pattern of gate structures to be formed, and an etch process is performed using the patterned hard mask layer to etch the sacrificial polysilicon layer and the sacrificial gate dielectric layer to define the sacrificial gate structure. In some embodiments, remaining portions of the hard mask layer form a cap layer over the portions of the sacrificial polysilicon layer remaining after the etch process. In some embodiments, the sacrificial gate structure is later replaced with the gate structure 8 comprising a gate dielectric layer and a gate electrode (not separately shown).

In some embodiments, the gate dielectric layer comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2. In some embodiments, the gate dielectric layer comprises a native oxide layer formed by exposure of the semiconductor device 100 to oxygen at various points in the process flow, causing the formation of silicon dioxide on exposed surfaces of the fin 4. In some embodiments, an additional layer of dielectric material, such as silicon dioxide, a high-k dielectric material, or other suitable material, is formed over the native oxide to form the gate dielectric layer.

In some embodiments, the gate electrode comprises a barrier layer, one or more work function material layers, a seed layer, a metal fill layer, or other suitable layers. In some embodiments, the metal fill layer comprises tungsten (W) or other suitable material. In some embodiments, the gate dielectric layer and the one or more layers that comprise the gate electrode are deposited by at least one of atomic layer deposition (ALD), physical vapor deposition (PVD), chemical vapor deposition (CVD), or other suitable processes.

In some embodiments, a sidewall spacer 10 is formed adjacent the gate structure 8. In some embodiments, the sidewall spacer 10 is formed by depositing a spacer layer over the gate structure 8 and performing an anisotropic etch process to remove horizontal portions of the spacer layer. In some embodiments, the sidewall spacer 10 comprises silicon nitride or other suitable materials.

In some embodiments, source/drain regions 12 are formed in the fin 4 after forming the gate structure 8. For example, in some embodiments, portions of the fin 4 are doped through an implantation process to form source/drain regions 12 in the fin 4. In some embodiments, the source/drain regions 12 are formed over the fin 4 after forming the gate structure 8. For example, in some embodiments, an etch process is performed to recess the fin 4 adjacent the sidewall spacer 10 and an epitaxial growth process is performed to form the source/drain regions 12.

In some embodiments, the device layer 110 comprises a dielectric layer 120. In some embodiments, the dielectric layer 120 comprises silicon dioxide or a low-k material. In some embodiments, the dielectric layer 120 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the materials for the dielectric layer 120 comprise at least one of Si, O, C, or H, such as SiCOH, SiOC, oxygen-doped SiC (ODC), nitrogen-doped SiC (NDC), plasma-enhanced oxide (PEOX), or other suitable materials. Organic material such as polymers may be used for the dielectric layer 120. In some embodiments, the dielectric layer 120 comprises one or more layers of a carbon-containing material, organo-silicate glass, a porogen-containing material, or combinations thereof. The dielectric layer 120 comprises nitrogen in some embodiments. In some embodiments, the dielectric layer 120 is formed by using, for example, at least one of plasma-enhanced CVD (PECVD), low pressure CVD (LPCVD), atomic layer CVD (ALCVD), or a spin-on technology.

In some embodiments, a gate contact 125 is formed in the dielectric layer 120 to contact the gate structure 8 or a gate electrode of the gate structure 8. In some embodiments, the gate contact 125 is formed by using a patterned etch mask to etch a recess in the dielectric layer 120 to expose the gate structure 8 and forming a conductive material in the recess. In some embodiments, the conductive material comprises tungsten, aluminum, copper, cobalt, or other suitable material. In some embodiments, the gate contact 125 comprises a plurality of layers, such as a barrier layer, a seed layer, and a conductive fill layer.

In some embodiments, the first metallization layer 115 comprises an etch stop layer 130. In some embodiments, the etch stop layer 130 comprises silicon nitride (SiN), aluminum oxide ($Al_xO_y$), aluminum nitride (AlN), cobalt oxide ($Co_xO_y$), or other suitable material, where x and y are greater than 0. In some embodiments, the etch stop layer 130 is formed by a deposition process, such as CVD, PVD, PECVD, ALCVD, ALD, a spin-on technology, or other suitable deposition process.

In some embodiments, a dielectric layer 135 is formed over the etch stop layer 130. In some embodiments, the dielectric layer 135 comprises silicon dioxide or a low-k material. In some embodiments, the dielectric layer 135 comprises one or more layers of low-k dielectric material. In some embodiments, the materials for the dielectric layer 135 comprise at least one of Si, O, C, or H, such as SiCOH, SiOC, oxygen-doped SiC (ODC), nitrogen-doped SiC (NDC), plasma-enhanced oxide (PEOX) or other suitable materials. Organic material such as polymers may be used for the dielectric layer 135. In some embodiments, the dielectric layer 135 comprises one or more layers of a carbon-containing material, organo-silicate glass, a porogen-containing material, or combinations thereof. The dielectric layer 135 comprises nitrogen in some embodiments. In some embodiments, the dielectric layer 135 is formed by using, for example, at least one of PECVD, LPCVD, ALCVD, or a spin-on technology. In some embodiments, the dielectric layer 135 comprises a same material composition as the dielectric layer 120. In some embodiments, the etch stop layer 130 between the dielectric layer 120 and the dielectric layer 135 provides etch control when etching through the dielectric layer 135 to form a cavity for a conductive feature or to expose an underling feature, such as the gate contact 125.

In some embodiments, an etch stop layer 140 is formed over the dielectric layer 135. In some embodiments, the etch stop layer 140 comprises silicon nitride (SiN), aluminum oxide ($Al_xO_y$), aluminum nitride (AlN), cobalt oxide ($Co_xO_y$), or other suitable material, where x and y are greater than 0. In some embodiments, the etch stop layer 140 is formed by a deposition process, such as CVD, PVD, PECVD, ALCVD, ALD, a spin-on technology, or other suitable deposition process. In some embodiments, the etch stop layer 140 comprises a same material composition as the etch stop layer 130.

In some embodiments, a sacrificial layer 145 is formed over the etch stop layer 140. In some embodiments, the a sacrificial layer 145 comprises a dielectric material. In some embodiments, the sacrificial layer 145 comprises silicon dioxide or a low-k material. In some embodiments, the materials for the sacrificial layer 145 comprise at least one of Si, O, C, or H, such as SiCOH, SiOC, oxygen-doped SiC (ODC), nitrogen-doped SiC (NDC), plasma-enhanced oxide (PEOX), or other suitable materials. Organic material such as polymers may be used for the sacrificial layer 145. In some embodiments, the sacrificial layer 145 comprises one or more layers of a carbon-containing material, organosilicate glass, a porogen-containing material, or combinations thereof. The sacrificial layer 145 comprises nitrogen in some embodiments. In some embodiments, the sacrificial layer 145 comprises a same material composition as the dielectric layer 120. In some embodiments, the sacrificial layer 145 comprises a same material composition as the dielectric layer 135. In some embodiments, the sacrificial layer 145 is formed by using, for example, at least one of PECVD, LPCVD, ALCVD, or a spin-on technology.

In some embodiments, a patterned mask layer 150 is formed over the sacrificial layer 145. The patterned mask layer 150 comprises openings 155. In some embodiments, the patterned mask layer 150 defines a pattern for etching trenches. According to some embodiments, the patterned mask layer 150 comprises a plurality of individually formed layers that together define a patterned mask stack. In some embodiments, the patterned mask layer 150 comprises a hard mask layer formed over the sacrificial layer 145 by at least one of CVD, LPCVD, PECVD, ultrahigh vacuum CVD (UHVCVD), reduced pressure CVD (RPCVD), ALD, physical vapor deposition, pulsed laser deposition, sputtering, evaporative deposition, vapor phase epitaxy (VPE), molecular beam epitaxy (MBE), liquid phase epitaxy (LPE), or other applicable techniques. In some embodiments, the hard mask layer comprises silicon and nitrogen. In some embodiments, the patterned mask layer 150 comprises a bottom antireflective coating (BARC) layer formed over the hard mask layer. In some embodiments, the BARC layer is a polymer layer that is applied using a spin coating process. In some embodiments, an organic planarization layer (OPL) is formed over the BARC layer. In some embodiments, the OPL layer comprises a photo-sensitive organic polymer that is applied using a spin coating process. In some embodiments, the OPL layer comprises a dielectric layer. According to some embodiments, the patterned mask layer 150 comprises a photoresist layer formed over the OPL layer. In some embodiments, the photoresist layer is formed by at least one of spinning, spray coating, or other applicable techniques. The photoresist layer comprises an electromagnetic radiation sensitive material, and properties, such as solubility, of the photoresist layer are affected by electromagnetic radiation. The photoresist layer is either a negative photoresist or a positive photoresist. In some embodiments, portions of the OPL layer irradiated by the electromagnetic radiation that patterns the photoresist layer are affected to change the etch selectivity of the irradiated portions of the OPL layer with respect to non-irradiated portions.

Figure 2:
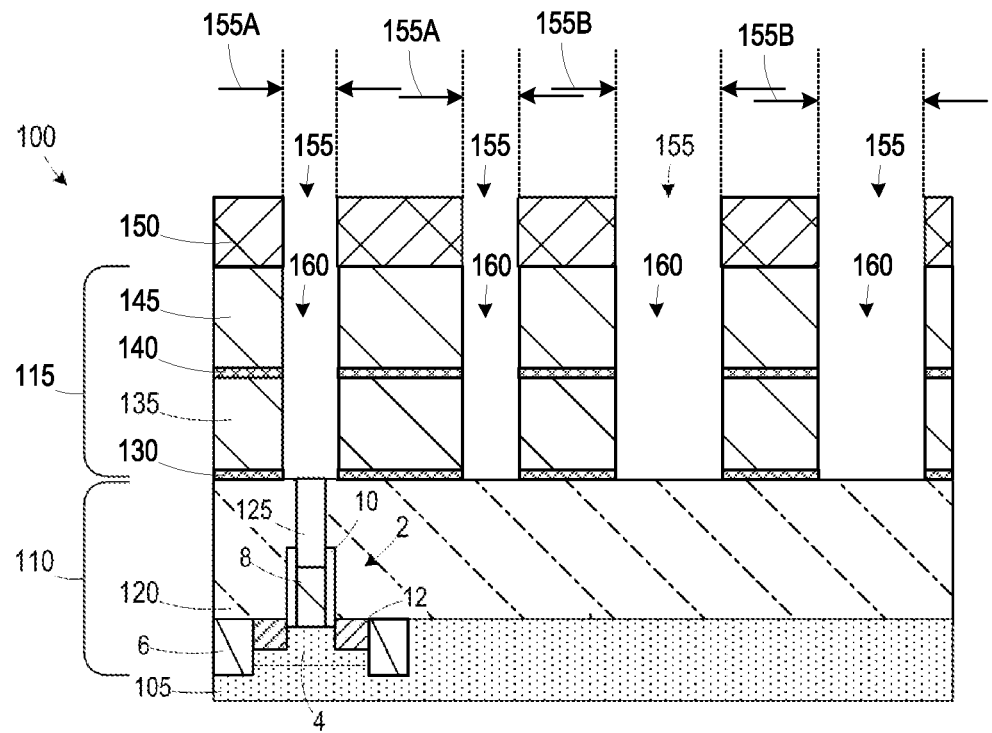

Referring to FIG. 2, portions of the sacrificial layer 145, the etch stop layer 140, and the dielectric layer 135 exposed by the openings 155 are removed to define trenches 160, in accordance with some embodiments. In some embodiments, the trenches 160 have, in a horizontal plane, widths 155A, 155B (extending left and right on the page) and axial lengths (extending into and out of the page) greater than the associated width 155A, 155B. In some embodiments, the widths 155A, 155B are different. In some embodiments, an etch process is performed to remove the portions of the sacrificial layer 145, the etch stop layer 140, and the dielectric layer 135. In some embodiments, the etch process comprises multiple steps using etchants suitable for the materials of the sacrificial layer 145, the etch stop layer 140, and the dielectric layer 135. In some embodiments, the etch process is terminated on the etch stop layer 130. In some embodiments, a second etch process is used to selectively remove portions of the etch stop layer 130 to expose underlying features in the device layer 110, such as the gate contact 125. In some embodiments, an additional patterned etch mask is used to selectively remove selected portions of the etch stop layer 130 in selected trenches 160, such as to remove a portion of the etch stop layer 130 overlying the gate contact 125 while preserving a portion of the etch stop layer 130 in the trench 160 that does not overlie the gate contact, such as located further into the page.

Figure 3:
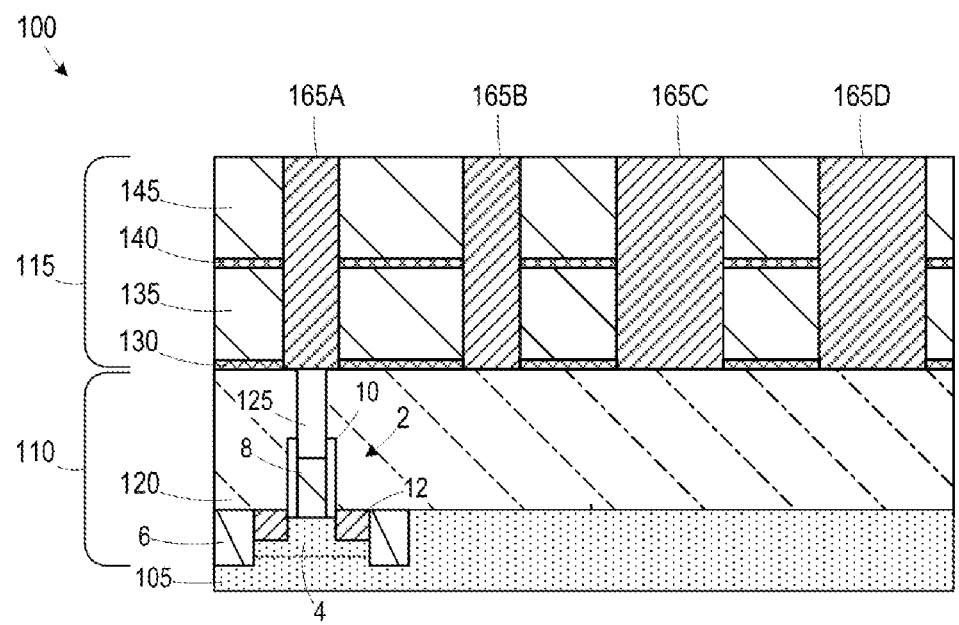

Referring to FIG. 3, the patterned mask layer 150 is removed and conductive lines 165A, 165B, 165C, 165D are formed in the trenches 160, in accordance with some embodiments. In some embodiments, an etch process is performed to remove the patterned mask layer 150. In some embodiments, the conductive lines 165A, 165B, 165C, 165D comprise a metal. In some embodiments, the metal comprises tungsten, aluminum, copper, cobalt, ruthenium, titanium, molybdenum, iridium, or other suitable material. In some embodiments, the conductive lines 165A, 165B, 165C, 165D comprise a silicide material. In some embodiments, the conductive lines 165A, 165B, 165C, 165D comprise a plurality of layers, such as a barrier layer, a seed layer, and a conductive fill layer. In some embodiments, the conductive lines 165A, 165B, 165C, 165D have, in a horizontal plane, widths 167A, 167B (extending left and right on the page) and axial lengths (extending into and out of the page) greater than the associated width 167A, 167B. In some embodiments, the widths 167A, 167B are different. In some embodiments, the conductive lines 165A, 165B, 165C, 165D are formed by filling the trenches 160 with a material of the conductive lines 165A, 165B, 165C, 165D. In some embodiments, the material of the conductive lines 165A, 165B, 165C, 165D overfills the trenches 160, and a planarization process is performed to remove portions outside the trenches 160. In some embodiments, the planarization process comprises a chemical mechanical planarization (CMP) process.

Figure 4:
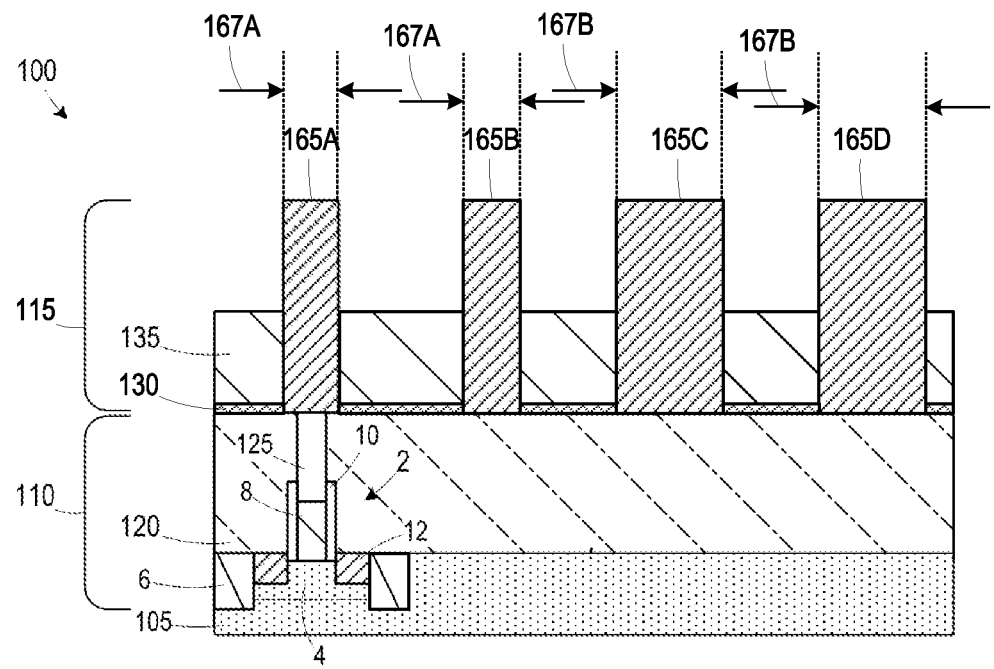

Referring to FIG. 4, the sacrificial layer 145 and the etch stop layer 140 are removed, in accordance with some embodiments. In some embodiments, one or more etch processes are performed to remove the sacrificial layer 145 and the etch stop layer 140. In some embodiments, the etch stop layer 140 protects the dielectric layer 135 during removal of the sacrificial layer 145, and the etch selectivity between the etch stop layer 140 and the dielectric layer 135 avoids etching of the dielectric layer 135 during removal of the etch stop layer 140.

Figure 5:
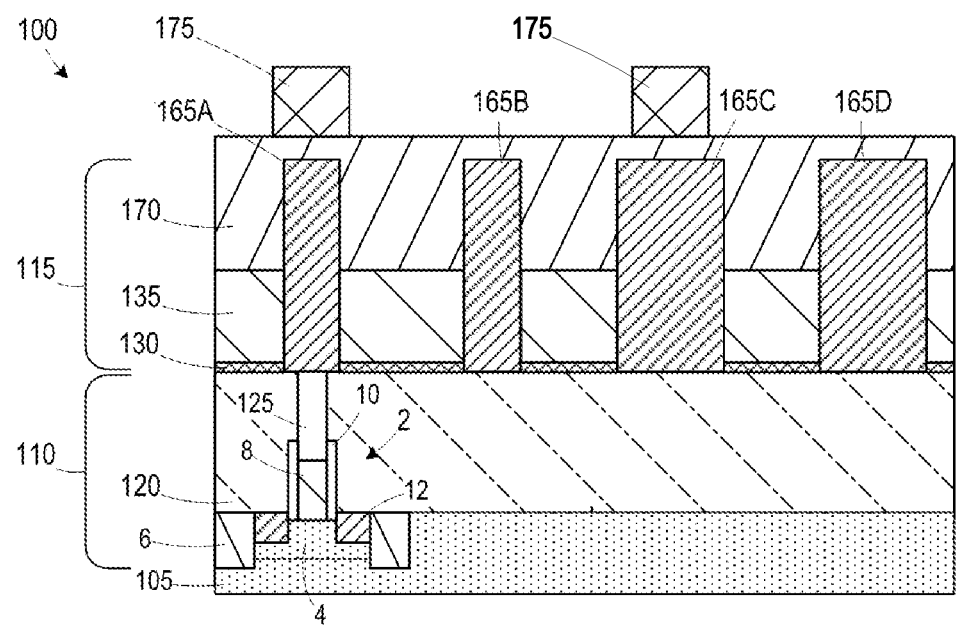
Figure 6:
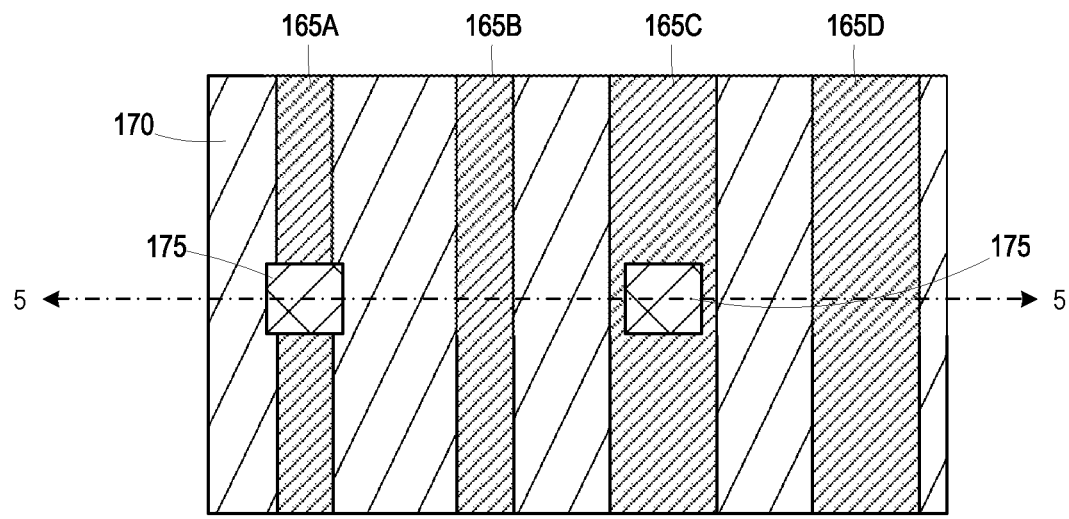

Referring to FIGS. 5 and 6, where FIG. 6 is a top view of the semiconductor device 100 and FIG. 5 is a cross-sectional view through the line 5-5, a sacrificial layer 170 is formed over the dielectric layer 135 and over the conductive lines 165A, 165B, 165C, 165D, in accordance with some embodiments. In some embodiments, the sacrificial layer 170 comprises an organic polymer. In some embodiments, the sacrificial layer 170 comprises $C_xH_yO_z$, where x, y, and z are each greater than zero. In some embodiments, the sacrificial layer 170 is applied using a spin coating process.

In some embodiments, a patterned mask layer 175 is formed over the sacrificial layer 170. In some embodiments, the patterned mask layer 175 is formed over the conductive lines 165A, 165B, 165C, 165D. In some embodiments, the patterned mask layer 175 is formed to overlie a select subset of the conductive lines 165A, 165B, 165C, 165D, such as a first conductive line 165A and a third conductive line 165C. Referring to FIG. 6, in some embodiments the patterned mask layer 175 is formed to overlie merely portions of a subset of the conductive lines 165A, 165B, 165C, 165D. For example, in the illustrated embodiment, the patterned mask layer 175 is formed to overlie a portion of the first conductive line 165A and a portion of the third conductive line 165C. In some embodiments, the sacrificial layer 170 comprises a dielectric layer. In some embodiments, the patterned mask layer 175 comprises photoresist. In some embodiments, the patterned mask layer 175 defines a pattern for forming pillars from the conductive lines 165A, 165B, 165C, 165D that the patterned mask layer 175 overlies. In some embodiments, such as with the conductive line 165A, the portion of the patterned mask layer 175 over the conductive line 165A is wider than the conductive line 165A to avoid reducing the width of the pillar to be formed relative to the width of the conductive line 165A. In some embodiments, such as with the conductive line 165C, the portion of the patterned mask layer 175 over the conductive line 165C is narrower than the conductive line 165C to reduce the width of the pillar to be formed relative to the width of the conductive line 165C.

Figure 7:
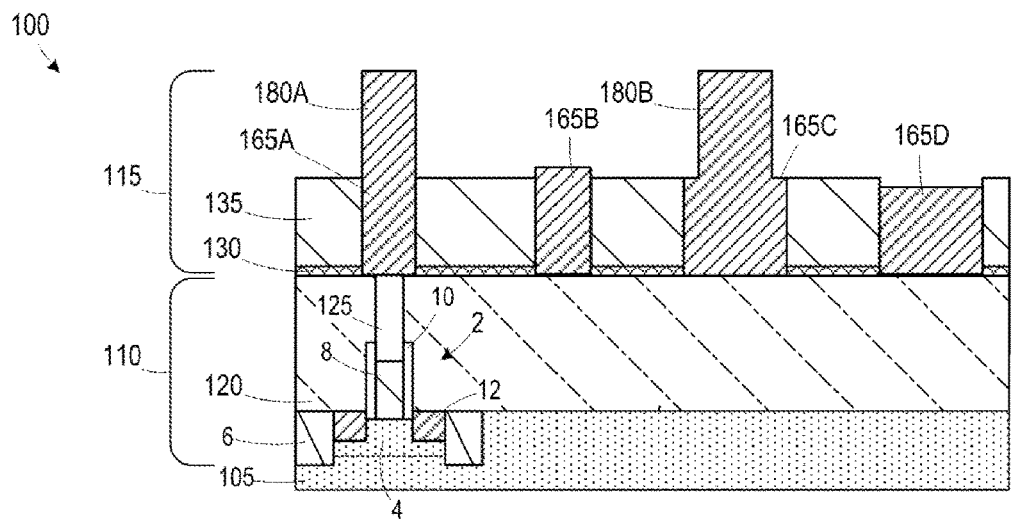
Figure 8:
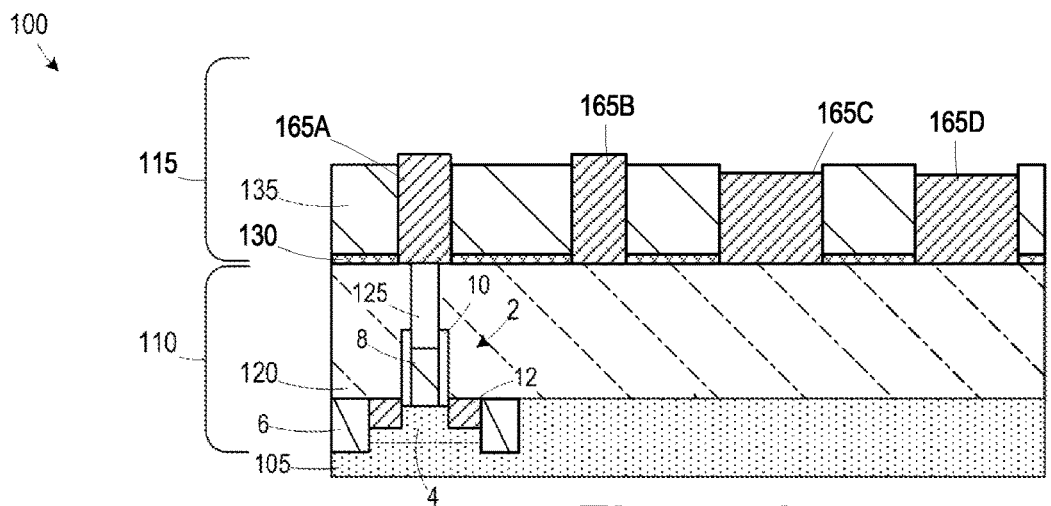
Figure 9:
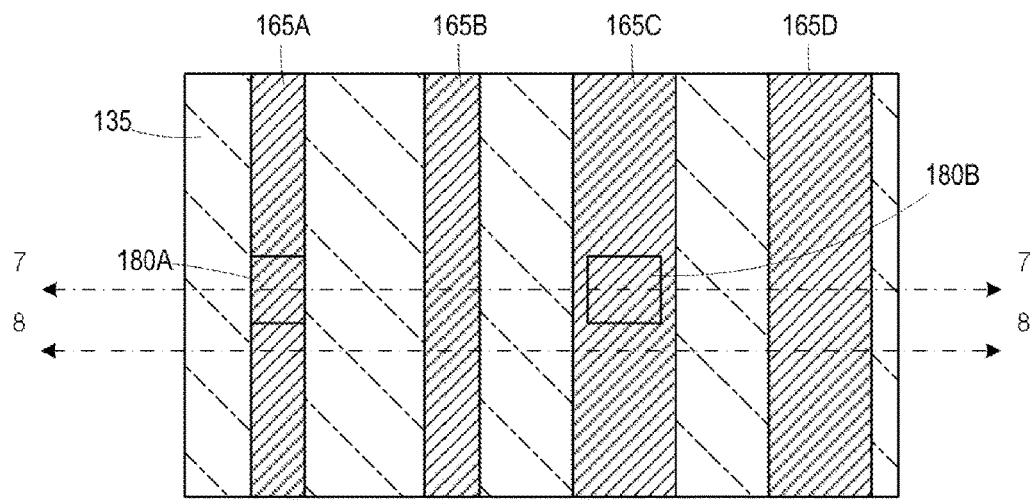

Referring to FIGS. 7-9, where FIG. 9 is a top view of the semiconductor device 100, FIG. 7 is a cross-sectional view through the line 7-7 and FIG. 8 is a cross-sectional view through line 8-8, conductive pillars 180A, 180B are formed in the conductive lines 165A, 165C using the patterned mask layer 175, in accordance with some embodiments. In some embodiments, an etch process is performed to remove portions of the sacrificial layer 170 and the conductive lines 165A, 165B, 165C, 165D not covered by the patterned mask layer 175 to define the conductive pillars 180A, 180B. In some embodiments, the etching proceeds at different rates for the conductive lines 165A, 165B, 165C, 165D depending on the dimensions of the conductive lines 165A, 165B, 165C, 165D. For example, the conductive lines 165C, 165D are etched at a faster rate than the conductive lines 165A, 165B due to the width of the conductive lines 165C, 165D being wider than the conductive lines 165A, 165B and thus having a different aspect ratio than the conductive lines 165A, 165B. In some embodiments, as a result of the different etch rates, the conductive lines 165C, 165D are recessed with respect to an upper surface of the dielectric layer 135, and the conductive lines 165A, 165B extend above the upper surface of the dielectric layer 135. The difference between the heights of the conductive lines 165A, 165B, 165C, 165D is referred to as trench loading. In some embodiments, the trench loading between a height of a tallest conductive line 165A, 165B, 165C, 165D after the etch process and a height of the shortest conductive line 165A, 165B, 165C, 165D is between about 10 and 100 angstroms. In some embodiments, the patterned mask layer 175 and the remaining portions of the sacrificial layer 170 are removed to expose the conductive pillars 180A, 180B. In some embodiments, one or more etch processes are performed to remove patterned mask layer 175 and the remaining portions of the sacrificial layer 170.

Figure 10:
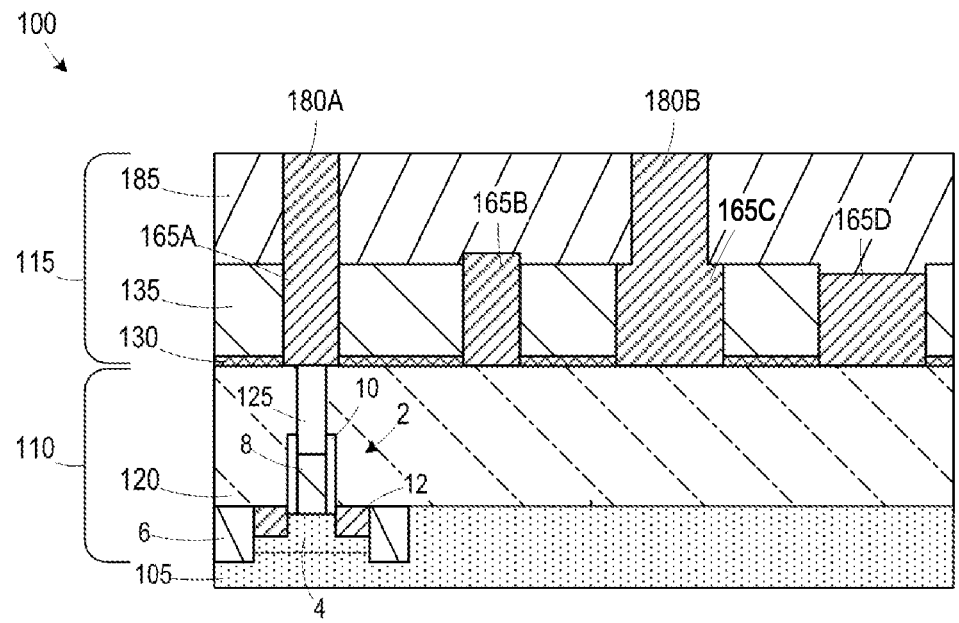

Referring to FIG. 10, a dielectric layer 185 is formed over the dielectric layer 135 and the conductive lines 165A, 165B, 165C, 165D, in accordance with some embodiments. In some embodiments, the dielectric layer 185 comprises silicon dioxide or a low-k material. In some embodiments, the dielectric layer 185 comprises one or more layers of low-k dielectric material. In some embodiments, the materials for the dielectric layer 185 comprise at least one of Si, O, C, or H, such as SiCOH, SiOC, oxygen-doped SiC (ODC), nitrogen-doped SiC (NDC), plasma-enhanced oxide (PEOX), or other suitable materials. Organic material such as polymers may be used for the dielectric layer 185. In some embodiments, the dielectric layer 185 comprises one or more layers of a carbon-containing material, organo-silicate glass, a porogen-containing material, or combinations thereof. The dielectric layer 185 comprises nitrogen in some embodiments. In some embodiments, the dielectric layer 185 is formed by using, for example, at least one of PECVD, LPCVD, ALCVD, or a spin-on technology. In some embodiments, the dielectric layer 185 comprises a same material composition as at least one of the dielectric layer 120 or the dielectric layer 135. In some embodiments, a planarization process is performed to remove portions of the dielectric layer 185 overlying the conductive pillars 180A, 180B to expose the conductive pillars 180A, 180B. In some embodiments, the planarization process comprises a chemical mechanical planarization (CMP) process.

Figure 11:
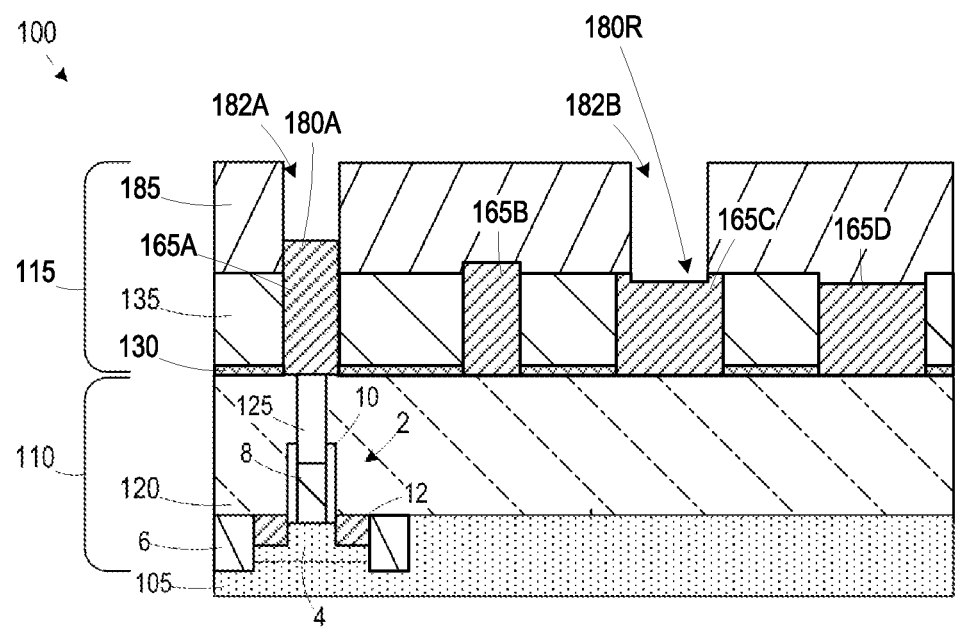

Referring to FIG. 11, the conductive pillars 180A, 180B are recessed to define via recesses 182A, 182B, in accordance with some embodiments. In some embodiments, an etch process is performed to recess the conductive pillars 180A, 180B. In some embodiments, the conductive pillars 180A, 180B are recessed by about 10-100 angstroms. In some embodiments, a portion of the conductive pillar 180A remains above the conductive line 165A. In some embodiments, the conductive pillars 180B is completely removed and a recess 180R is defined in a surface of the conductive line 165C. In some embodiments, the complete recessing of the conductive pillar 180B provides a via recess 182B extending to the conductive line 165C. As described below, in some embodiments, the dimensions of the via recess 182B may be altered by providing a dielectric material in a portion of the via recess 182B to control spacing between adjacent conductive features.

Figure 12:
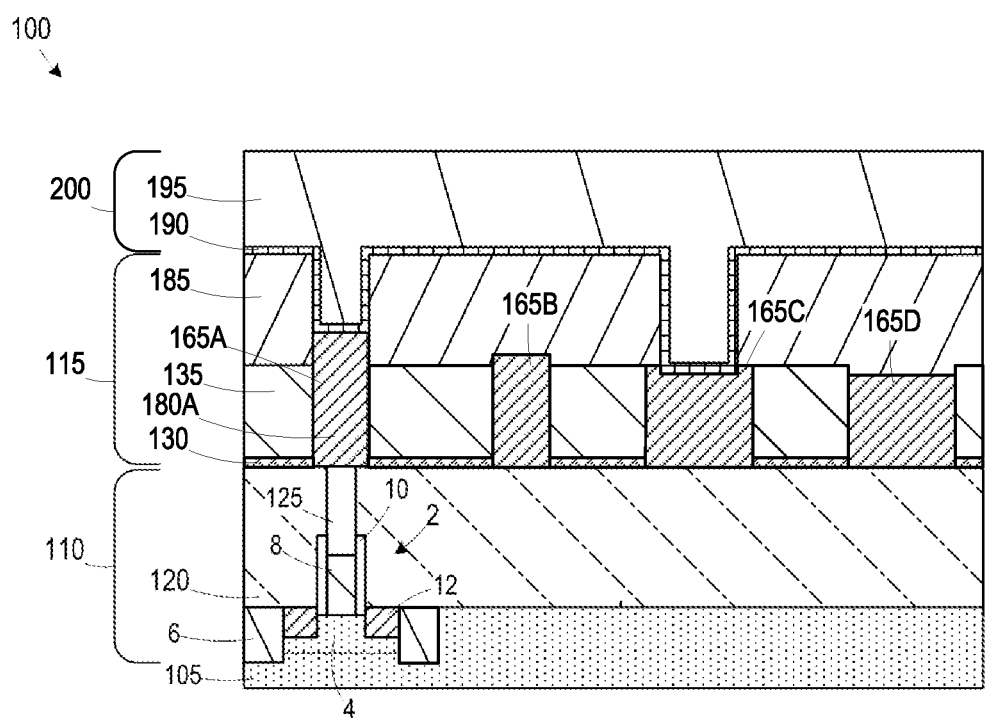

Referring to FIG. 12, an etch stop layer 190 is formed over the dielectric layer 185 and the exposed portions of the conductive lines 165A, 165C, and a dielectric layer 195 is formed over the etch stop layer 190, in accordance with some embodiments. In some embodiments, the etch stop layer 190 comprises silicon nitride (SiN), aluminum oxide ($Al_xO_y$), aluminum nitride (AlN), cobalt oxide ($Co_xO_y$), or other suitable material, where x and y are greater than zero. In some embodiments, the etch stop layer 190 is formed by a deposition process, such as CVD, PVD, PECVD, ALCVD, ALD, a spin-on technology, or other suitable deposition process. In some embodiments, the dielectric layer 195 comprises silicon dioxide or a low-k material. In some embodiments, the dielectric layer 195 comprises one or more layers of low-k dielectric material. In some embodiments, the materials for the dielectric layer 195 comprise at least one of Si, O, C, or H, such as SiCOH, SiOC, oxygen-doped SiC (ODC), nitrogen-doped SiC (NDC), plasma-enhanced oxide (PEOX), or other suitable materials. Organic material such as polymers may be used for the dielectric layer 195. In some embodiments, the dielectric layer 195 comprises one or more layers of a carbon-containing material, organo-silicate glass, a porogen-containing material, or combinations thereof. The dielectric layer 195 comprises nitrogen in some embodiments. In some embodiments, the dielectric layer 195 is formed by using, for example, at least one of PECVD, LPCVD, ALCVD, or a spin-on technology. In some embodiments, the dielectric layer 195 comprises a same material composition as at least one of the dielectric layer 120, the dielectric layer 135, or the dielectric layer 185. In some embodiments, the dielectric layer 195 comprises a different material composition than the dielectric layer 185 to provide etch selectivity between the dielectric layer 195 and the dielectric layer 185. In some embodiments, the etch stop layer 190 is omitted if the etch selectivity between the dielectric layer 185 and the dielectric layer 195 is sufficiently different. In some embodiments, the dielectric layer 195 is part of a second metallization layer 200 formed over the first metallization layer 115.

Figure 13:
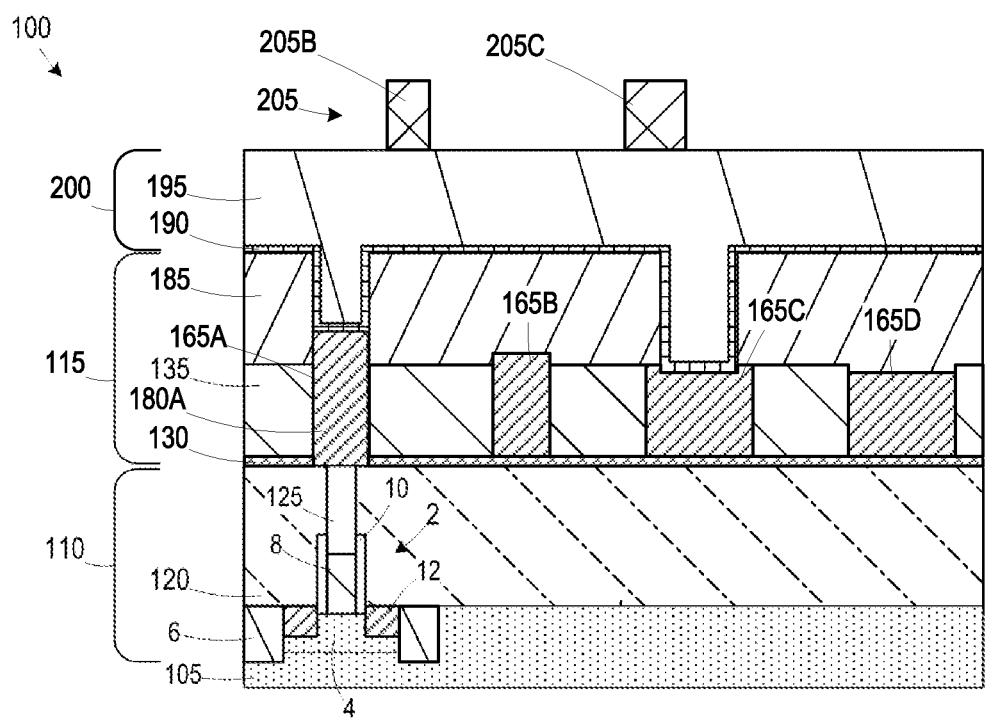
Figure 14:
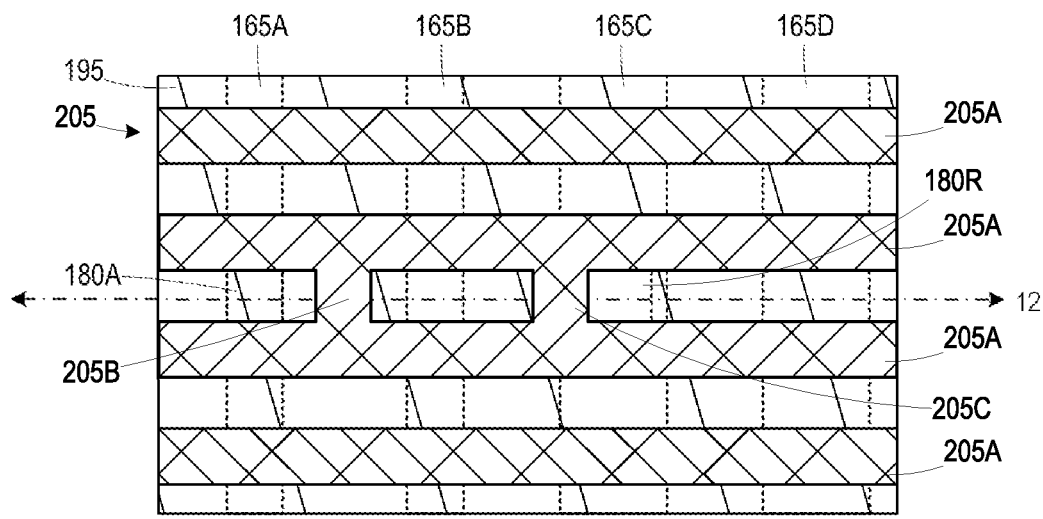

Referring to FIGS. 13 and 14, where FIG. 14 is a top view of the semiconductor device 100 and FIG. 13 is a cross-sectional view through line 13-13, a patterned mask layer 205 is formed over the dielectric layer 195, in accordance with some embodiments. In some embodiments, the patterned mask layer 205 comprises trench features 205A and line cut features 205B, 205C. According to some embodiments, the patterned mask layer 205 is formed by forming a plurality of individually formed layers that together define a patterned mask stack, as described above in reference to the patterned mask layer 150. In some embodiments, the patterned mask layer 205 comprises a hard mask layer formed over the dielectric layer 195. In some embodiments, the line cut feature 205B is positioned between the conductive lines 165A, 165B proximate the conductive pillar 180A. In some embodiments, the line cut feature 205C is positioned to overlap at least a portion of the conductive line 165C and the recess 180R. In some embodiments, the position of the line cut features 205B, 205C corresponds to locations where a line in the second metallization layer 200 is to be cut in the length direction to define line segments.

Figure 15:
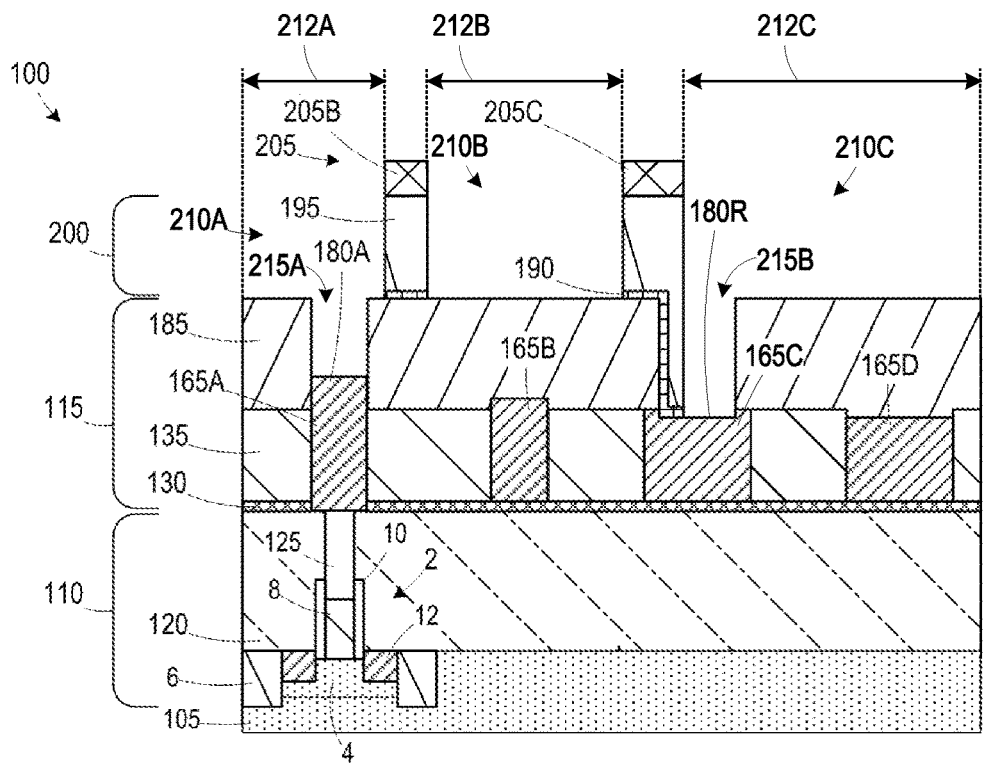

Referring to FIG. 15, portions of the dielectric layer 195 and the etch stop layer 190 exposed by the openings in the patterned mask layer 205 are removed to define trenches 210A, 210B, 210C and via openings 215A, 215B in the dielectric layer 195, in accordance with some embodiments. In some embodiments, the trenches 210A, 210B, 210C have, in a horizontal plane, widths 212A, 212B, 212C (extending left and right on the page) and axial lengths (extending into and out of the page) greater than the associated widths 212A, 212B, 212C. In some embodiments, an etch process is performed to remove the portions of the dielectric layer 195. In some embodiments, an additional etch process is performed to remove the etch stop layer 190 after forming the trenches 210A, 210B, 210C. In some embodiments, the via opening 215A exposes the conductive pillar 180A. In some embodiments, the via opening 215B exposes the conductive line 165C and a portion of the recess 180R. In some embodiments, a remaining portion 195R of the dielectric layer 195 is positioned in the via recess 182B. In some embodiments, the remaining portion 195R of the dielectric layer 195 reduces a width of the via opening 215B. In some embodiments, because the dielectric layer 195 comprises a different material composition as the dielectric layer 185 or because of the presence of the etch stop layer 190, the etch process for forming the via openings 215A, 215B is self-aligned.

Figure 16:
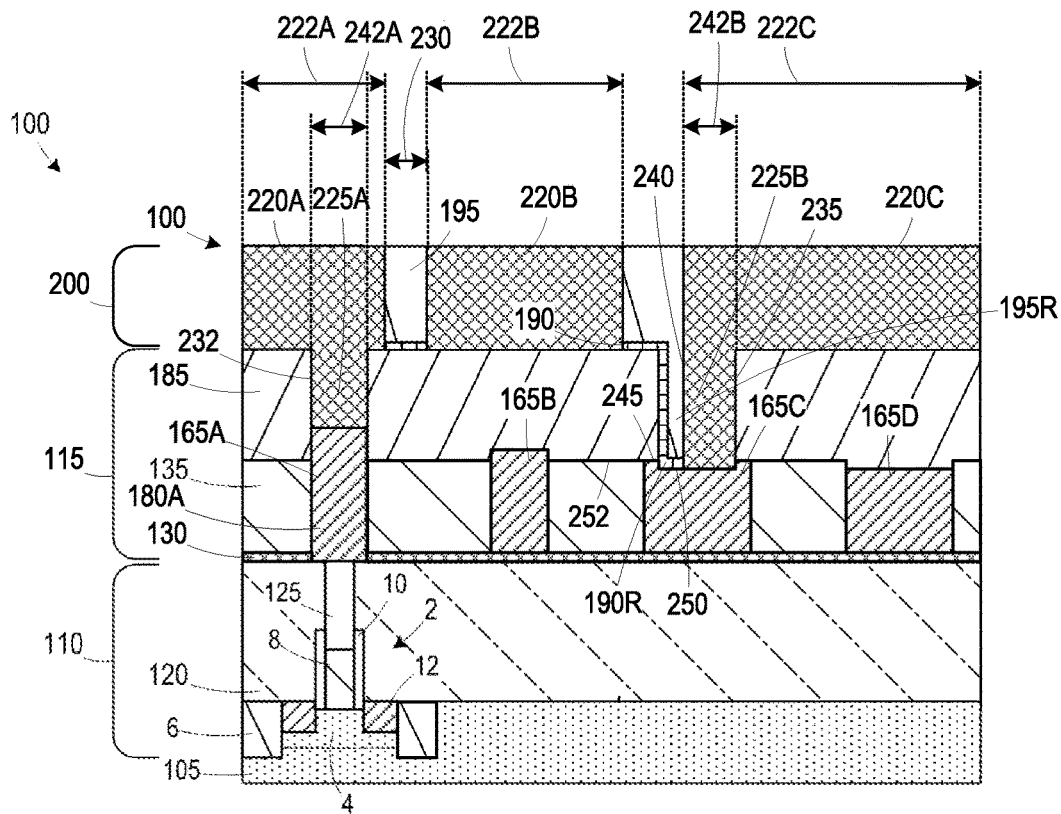

Referring to FIG. 16, the patterned mask layer 205 is removed, conductive lines 220A, 220B, 220C are formed in the trenches 210A, 210B, 210C, and conductive vias 225A, 225B are formed in the via openings 215A, 215B, in accordance with some embodiments. In some embodiments, the conductive via 225A is over and contacts the conductive pillar 180A. In some embodiments, the conductive via 225B is over and contacts the conductive line 165C. In some embodiments, the conductive vias 225A, 225B have dimensions in a horizontal direction of between about 3 nm and 25 nm.

In some embodiments, the conductive lines 220A, 220B, 220C and the conductive vias 225A, 225B comprise a metal. In some embodiments, the metal comprises tungsten, aluminum, copper, cobalt, ruthenium, titanium, molybdenum, iridium, or other suitable material. In some embodiments, the conductive lines 220A, 220B, 220C and the conductive vias 225A, 225B comprise a silicide material. In some embodiments, the conductive lines 220A, 220B, 220C and the conductive vias 225A, 225B comprise a plurality of layers, such as a barrier layer, a seed layer, and a conductive fill layer. In some embodiments, the conductive lines 220A, 220B, 220C have, in a horizontal plane, widths 222A, 222B, 222C (extending left and right on the page) and axial lengths (extending into and out of the page) greater than the associated widths 222A, 222B, 222C.

In some embodiments, the dielectric layer 185 contacts a sidewall surface 232 of the conductive via 225A. In some embodiments, the dielectric layer 185 contacts a first sidewall surface 235 of the conductive via 225B, and the remaining portion 195R of the dielectric layer 195 positioned in the via recess 182B contacts a second sidewall surface 240 of the conductive via 225B. In some embodiments, the remaining portion 195R of the dielectric layer 195 is positioned between the second sidewall surface 240 of the conductive via 225B and the dielectric layer 185. In some embodiments, the remaining portion 195R of the dielectric layer 195 defines the spacing between the conductive via 225B and the conductive line 220B and the spacing between the conductive lines 220B, 220C. In some embodiments, the remaining portion 195R of the dielectric layer 195 also determines a width 242B of the conductive via 225B. In some embodiments, the width 242B of the conductive via 225B is less than a width 242A of the conductive via 225A.

In some embodiments, the dielectric layer 185 contacts an upper surface 245 of the conductive line 165C. In some embodiments, the etch stop layer 190 is positioned between the dielectric layer 185 and the remaining portion 195R of the dielectric layer 195 adjacent the second sidewall surface 240 of the conductive via 225B. In some embodiments, a remaining portion 190R of the etch stop layer 190 contacts an upper surface 250 of the conductive line 165C in the recess 180R. In some embodiments, the upper surface 250 is positioned at a height lower than a height of the upper surface 245 of the conductive line 165C and an upper surface 252 of the dielectric layer 135. In some embodiments, the upper surface 245 of the conductive line 165C is coplanar with the upper surface 252 of the dielectric layer 135.

In some embodiments, the conductive lines 220A, 220B, 220C and the conductive vias 225A, 225B are formed by filling the trenches 210A, 210B, 210C and the via openings 215A, 215B with a material of the conductive lines 220A, 220B, 220C and the conductive vias 225A, 225B. In some embodiments, the material of the conductive lines 220A, 220B, 220C overfills the trenches 210A, 210B, 210C and a planarization process is performed to remove portions outside the trenches 210A, 210B, 210C. In some embodiments, the planarization process comprises a chemical mechanical planarization (CMP) process. In some embodiments, a tip-to-tip spacing 230 between the conductive lines 220A, 220B is between about 3 nm and 25 nm.

In some embodiments, the conductive pillars 180A, 180B in the first metallization layer 115 serve as alignment features for forming the conductive vias 225A, 225B in the second metallization layer 200. In some embodiments, self-aligning the conductive vias 225A, 225B mitigates time-dependent dielectric breakdown (TDDB) arising from misalignment of vias between metallization layers. In some embodiments, recessing the conductive pillar 180B into the conductive line 165C allows the line cut feature 205C to be used to control TDDB window defined by the spacing between the conductive via 225B and the underlying conductive line 165B.

In some embodiments, a semiconductor device includes a conductive line and a conductive via over and contacting the conductive line. A first dielectric material contacts a first sidewall surface of the conductive via. A second dielectric material contacts a second sidewall surface of the conductive via. The first dielectric material includes a first material composition, and the second dielectric material includes a second material composition different than the first material composition.

In some embodiments, a method of forming a semiconductor device includes forming a first dielectric layer. A first conductive material is formed in a first trench in the first dielectric layer. The first conductive material protrudes above the first trench to define a first conductive pillar. A second dielectric layer is formed laterally adjacent the first conductive pillar. A portion of the first conductive pillar is removed to define a first via recess in the second dielectric layer. A third dielectric layer is formed over the second dielectric layer and in the first via recess. A first portion of the third dielectric layer in the first via recess is removed. A second conductive material is formed in the first via recess and over the first via recess to define a first conductive line and a conductive via electrically coupling the first conductive line to the first conductive pillar.

In some embodiments, a method of forming a semiconductor device includes forming a first dielectric layer. A first conductive line is formed in the first dielectric layer. A portion of the first conductive line is removed to define a conductive pillar. A second dielectric layer is formed laterally adjacent the conductive pillar. A portion of the conductive pillar and a portion of the first conductive line are removed to define a via recess in the second dielectric layer. A third dielectric layer is formed over the second dielectric layer and in the via recess. A trench is formed in the third dielectric layer. A first portion of the third dielectric layer in the via recess exposed by the trench is removed. A conductive material is formed in the trench and the via recess to define a second conductive line and a conductive via electrically coupling the second conductive line to the first conductive line. A second portion of the third dielectric layer remaining in the via recess is positioned between a sidewall surface of the conductive via and the second dielectric layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   forming a first dielectric layer;
   forming a first conductive material in a first trench in the first dielectric layer, the first conductive material protruding above the first trench to define a first conductive pillar;

forming a second dielectric layer laterally adjacent the first conductive pillar;
removing a portion of the first conductive pillar to define a first via recess in the second dielectric layer;
forming a third dielectric layer over the second dielectric layer and in the first via recess;
removing a first portion of the third dielectric layer in the first via recess; and
forming a second conductive material in the first via recess and over the first via recess to define a first conductive line and a conductive via electrically coupling the first conductive line to the first conductive pillar.

2. The method of claim 1, wherein:
forming the first conductive material to define a first conductive pillar, comprises:
  forming a first sacrificial layer over the first dielectric layer; and
  forming the first trench in the first sacrificial layer and the first dielectric layer, and
the method comprises removing the first sacrificial layer after forming the first conductive material to expose an upper portion of the first conductive material.

3. The method of claim 2, wherein forming the first conductive material to define a first conductive pillar comprises:
forming a second sacrificial layer over the upper portion of the first conductive material;
forming a patterned mask layer over the second sacrificial layer; and
removing portions of the second sacrificial layer and the first conductive material in the presence of the patterned mask layer to define the first conductive pillar.

4. The method of claim 1, wherein removing the first portion of the third dielectric layer comprises:
forming a patterned mask layer over the third dielectric layer, the patterned mask layer comprising a first trench opening;
removing a second portion of the third dielectric layer exposed by the first trench opening to define a second trench, wherein the first via recess is exposed by the second trench; and
removing the first portion of the third dielectric layer in the first via recess through the second trench.

5. The method of claim 4, wherein:
the patterned mask layer comprises a line cut feature positioned between the first trench opening and a second trench opening axially aligned with the first trench opening,
the method comprises:
  removing a third portion of the third dielectric layer exposed by the second trench opening to form a third trench in the third dielectric layer; and
  forming the second conductive material in the third trench to define a second conductive line axially aligned with the first conductive line, and
a fourth portion of the third dielectric layer positioned under the line cut feature is positioned between the first conductive line and the second conductive line.

6. The method of claim 1, comprising:
forming an etch stop layer over the second dielectric layer and in the first via recess prior to forming the third dielectric layer; and
removing a portion of the etch stop layer in the first via recess to expose a second portion of the first conductive pillar prior to forming the second conductive material.

7. The method of claim 1, comprising:
forming the first conductive material in a second trench, the first conductive material protruding above the second trench to define a second conductive pillar;
forming the second dielectric layer laterally adjacent the second conductive pillar;
removing the second conductive pillar to define a second via recess in the second dielectric layer;
forming the third dielectric layer in the second via recess;
removing a second portion of the third dielectric layer in the second via recess; and
forming the second conductive material in the second via recess and over the second via recess to define a second conductive line and a second conductive via electrically coupling the second conductive line to the second conductive pillar,
wherein a portion of the third dielectric layer remains in the second via recess between a sidewall surface of the second conductive via and the second dielectric layer.

8. A method, comprising:
forming a first dielectric layer;
forming a first conductive line in the first dielectric layer;
removing a portion of the first conductive line to define a conductive pillar;
forming a second dielectric layer laterally adjacent the conductive pillar;
removing a portion of the conductive pillar and a second portion of the first conductive line to define a via recess in the second dielectric layer;
forming a third dielectric layer over the second dielectric layer and in the via recess;
forming a trench in the third dielectric layer;
removing a first portion of the third dielectric layer in the via recess exposed by the trench; and
forming a conductive material in the trench and the via recess to define a second conductive line and a conductive via electrically coupling the second conductive line to the first conductive line,
wherein a second portion of the third dielectric layer remaining in the via recess is positioned between a sidewall surface of the conductive via and the second dielectric layer.

9. The method of claim 8, wherein:
forming the first conductive line comprises:
  forming a first sacrificial layer over the first dielectric layer;
  forming a second trench in the first sacrificial layer and the first dielectric layer; and
  forming a second conductive material in the second trench to define the first conductive line, and
the method comprises removing the first sacrificial layer after forming the second conductive material to expose an upper portion of the first conductive line.

10. The method of claim 9, wherein removing the portion of the first conductive line to define the conductive pillar comprises:
forming a second sacrificial layer over the upper portion of the first conductive line;
forming a patterned mask layer over the second sacrificial layer; and
removing portions of the second sacrificial layer and the first conductive line in the presence of the patterned mask layer to define the conductive pillar.

11. The method of claim 8, wherein forming the trench in the third dielectric layer comprises:

forming a patterned mask layer over the third dielectric layer, the patterned mask layer comprising a first trench opening; and removing a third portion of the third dielectric layer exposed by the first trench opening to define the trench.

12. The method of claim 11, wherein:

the patterned mask layer comprises a line cut feature positioned between the first trench opening and a second trench opening axially aligned with the first trench opening, the method comprises:

removing a fourth portion of the third dielectric layer exposed by the second trench opening to form a second trench in the third dielectric layer; and forming the conductive material in the second trench to define a third conductive line axially aligned with the second conductive line, the second portion of the third dielectric layer positioned under the line cut feature is positioned between the second conductive line and the third conductive line.

13. A method, comprising:

forming a first dielectric layer over a second dielectric layer and within a recess defined by the second dielectric layer;

removing a first portion of the first dielectric layer over the second dielectric layer to define a first trench, wherein a top surface of a portion of the second dielectric layer overlying a first conductive line is exposed through the first trench;

removing a second portion of the first dielectric layer within the recess to define a via opening;

forming a conductive material in the via opening to define a conductive via and in the first trench to define a second conductive line, wherein:

a first sidewall of the second dielectric layer is spaced apart from a first sidewall of the conductive via by a third portion of the first dielectric layer that remains within the recess after the second portion of the first dielectric layer is removed; and the second conductive line is spaced apart from the first conductive line by the portion of the second dielectric layer overlying the first conductive line.

14. The method of claim 13, comprising:

forming an etch stop layer in the recess prior to forming the first dielectric layer.

15. The method of claim 14, comprising:

removing a first portion of the etch stop layer prior to forming the conductive material, wherein the first sidewall of the second dielectric layer is spaced apart from the first sidewall of the conductive via by a second portion of the etch stop layer that remains within the recess after the first portion of the etch stop layer is removed.

16. The method of claim 14, wherein forming the conductive material comprises forming the conductive material to contact a sidewall of the etch stop layer.

17. The method of claim 13, wherein:

the method comprises removing a fourth portion of the first dielectric layer over the second dielectric layer to define a second trench, and forming the conductive material comprises forming the conductive material in the second trench to define a third conductive line electrically coupled to the conductive via.

18. The method of claim 17, wherein the second conductive line is separated from the third conductive line by a fifth portion of the first dielectric layer overlying the third portion of the first dielectric layer.

19. The method of claim 18, wherein the fifth portion of the first dielectric layer contacts the third portion of the first dielectric layer.

20. The method of claim 13, wherein:

removing the second portion of the first dielectric layer exposes a third conductive line, and forming the conductive material comprises forming the conductive material to contact the third conductive line.

* * * * *